(12) United States Patent
Ding et al.

(10) Patent No.: US 10,679,559 B2
(45) Date of Patent: Jun. 9, 2020

(54) DISPLAY DRIVING UNIT CIRCUIT, DRIVING METHOD, DISPLAY DRIVING CIRCUIT AND DISPLAY DEVICE

(71) Applicant: BOE TECHNOLOGY GROUP CO., LTD., Beijing (CN)

(72) Inventors: Xiaoliang Ding, Beijing (CN); Xue Dong, Beijing (CN); Jing Lv, Beijing (CN); Haisheng Wang, Beijing (CN); Chunwei Wu, Beijing (CN); Yingming Liu, Beijing (CN); Wei Liu, Beijing (CN); Pengpeng Wang, Beijing (CN); Yanling Han, Beijing (CN); Xueyou Cao, Beijing (CN); Ping Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/827,551

(22) Filed: Nov. 30, 2017

(65) Prior Publication Data

US 2018/0151122 A1    May 31, 2018

(30) Foreign Application Priority Data

Nov. 30, 2016  (CN) .......................... 2016 1 1079663

(51) Int. Cl.
*G09G 3/3258* (2016.01)
*H01L 27/32* (2006.01)
(Continued)

(52) U.S. Cl.
CPC ......... *G09G 3/3258* (2013.01); *G06K 9/0004* (2013.01); *G06K 9/00993* (2013.01);
(Continued)

(58) Field of Classification Search
None
See application file for complete search history.

(56) References Cited

U.S. PATENT DOCUMENTS

| 4,258,994 A | 3/1981 | Task |
| 2006/0017862 A1 | 1/2006 | Song et al. |

(Continued)

FOREIGN PATENT DOCUMENTS

| CN | 1689025 A | 10/2005 |
| CN | 105893992 A | 8/2016 |
| CN | 106055162 A | 10/2016 |

OTHER PUBLICATIONS

First Office Action for Chinese Application No. 201611079663.2, dated Dec. 5, 2018, 8 Pages.

*Primary Examiner* — Benjamin C Lee
*Assistant Examiner* — Emily J Frank
(74) *Attorney, Agent, or Firm* — Brooks Kushman P.C.

(57) ABSTRACT

A display driving unit circuit, a driving method, a display driving circuit and a display device are provided. The display driving unit circuit includes a pixel driving circuit and a light-emission control signal generation circuit. The light-emission control signal generation circuit is coupled to the pixel driving circuit. The pixel driving circuit is to drive a pixel to emit light. The light-emission control signal generation circuit is to supply a display light-emission control signal to the pixel driving circuit at a display stage to enable the pixel in a displaying mode and supply a fingerprint detection light-emission control signal to the pixel driving circuit at a fingerprint detection stage to enable the pixel in a fingerprint detection light-emission mode at the fingerprint detection stage. The display stage and the fingerprint detection stage are different time periods.

16 Claims, 4 Drawing Sheets

(51) Int. Cl.
  *G06K 9/00*   (2006.01)
  *G09G 3/3266*   (2016.01)
  *G09G 3/3233*   (2016.01)

(52) U.S. Cl.
  CPC ......... *G09G 3/3233* (2013.01); *G09G 3/3266* (2013.01); *H01L 27/3227* (2013.01); *G09G 2300/0465* (2013.01); *G09G 2300/0819* (2013.01); *G09G 2300/0842* (2013.01); *G09G 2300/0861* (2013.01); *G09G 2310/0286* (2013.01)

(56)  References Cited

U.S. PATENT DOCUMENTS

| | | |
|---|---|---|
| 2007/0187720 A1 | 8/2007 | Park et al. |
| 2015/0169136 A1* | 6/2015 | Ganti .................... B06B 1/0666 345/177 |
| 2015/0254491 A1* | 9/2015 | Mo ....................... G06F 3/0416 345/174 |
| 2015/0286306 A1* | 10/2015 | Abrams ................. G06F 3/042 345/175 |
| 2018/0075271 A1 | 3/2018 | Xu et al. |
| 2018/0150163 A1* | 5/2018 | Lee ....................... G06F 3/0416 |
| 2018/0307088 A1 | 10/2018 | Liu et al. |

\* cited by examiner

DISPLAY DRIVING UNIT CIRCUIT, DRIVING METHOD, DISPLAY DRIVING CIRCUIT AND DISPLAY DEVICE

CROSS-REFERENCE TO RELATED APPLICATIONS

This application claims priority to Chinese Patent Application No. 201611079663.2 filed on Nov. 30, 2016, which is incorporated herein by reference in its entirety.

TECHNICAL FIELD

The present disclosure relates to the field of display driving technology, in particular to a display driving unit circuit, a driving method, a display driving circuit and a display device.

BACKGROUND

Recently, with the rapid development of technologies, display products having a fingerprint detection function gradually come into people's lives and work. Due to uniqueness of fingerprints, the fingerprint detection technology has attracted much attention. Press-type and slide-type fingerprint recognition technologies on the basis of a silicon-based process have been integrated into a mobile product, and in future the focus of attention will be on the fingerprint recognition technology at a display region.

In a conventional photo sensor-based fingerprint detection unit, each fingerprint sensor consists of one photosensitive diode and one switching thin film transistor (TFT). In scanning a fingerprint, light beams from a light source may be reflected differently due to a difference between a valley and a ridge of the fingerprint, so the light intensity at the photosensitive diode may vary and thereby generate different photocurrents. Under the control of the switching TFT, the currents flowing through the photosensitive diode may be read sequentially, thereby achieving the detecting of the valleys and ridges of the fingerprint. However, the conventional fingerprint detection unit includes a plurality of switching TFTs, and in case that the performance of the switching TFT is deteriorated due to environmental facts, the switching TFT may be turned on or off erroneously. As a result, the fingerprint detection effect may be adversely affected. In addition, due to the switching TFTs, the aperture ratio of a display panel may be adversely affected.

SUMMARY

In one aspect, the present disclosure provides in some embodiments a display driving unit circuit, including a pixel driving circuit and a light-emission control signal generation circuit. The light-emission control signal generation circuit is coupled to the pixel driving circuit. The pixel driving circuit is configured to drive a pixel to emit light. The light-emission control signal generation circuit is configured to supply a display light-emission control signal to the pixel driving circuit at a display stage to enable the pixel in a displaying mode and supply a fingerprint detection light-emission control signal to the pixel driving circuit at a fingerprint detection stage to enable the pixel in a fingerprint detection light-emission mode. The display stage and the fingerprint detection stage are different time periods.

Further, the light emitted from the pixel in the displaying mode is of a first frequency, the light emitted from the pixel in the fingerprint detection light-emission mode is of a second frequency, and the first frequency is different from the second frequency.

Further, the fingerprint detection light-emission control signal is a square-wave light-emission control signal having a frequency equal to the second frequency. A cycle of the square-wave light-emission control signal includes a first time period in which the pixel driving circuit controls the pixel to emit light having a frequency equal to the first frequency under the control of the square-wave light-emission control signal and a second time period in which the pixel driving circuit controls the pixel to emit light having a frequency equal to the second frequency under the control of the square-wave light-emission control signal.

Further, the first frequency is substantially equal to 0 Hz, and the second frequency is greater than 1000 Hz.

Further, the display driving unit circuit further includes a voltage signal generation circuit. The voltage signal generation circuit is coupled to the light-emission control signal generation circuit and is configured to supply the fingerprint detection light-emission control signal to a light-emission control signal output end of the light-emission control signal generation circuit at the fingerprint detection stage.

Further, the voltage signal generation circuit includes a first start signal input end, a first clock signal output end, a second clock signal output end, a first level output end, a second level output end, a third level output end and a voltage signal output end. The voltage signal generation circuit further includes: a first voltage control node control circuit that is coupled to the first start signal input end, the first clock signal output end, the second clock signal output end, the first level output end, the second level output end and a first voltage control node, and is configured to enable a potential of the first voltage control node to be a first level and enable the potential of the first voltage control node to be a second level at the fingerprint detection stage under the control of the first start signal input end, the first clock signal output end, the second clock signal output end, the first level output end and the second level output end; a second voltage control node control circuit that is coupled to the first voltage control node, the first clock signal output end, the second clock signal output end, the first level output end, the second level output end and a second voltage control node, and is configured to enable a potential of the second voltage control node to be the second level and enable the potential of the second voltage control node to be the first level at the fingerprint detection stage under the control of the first voltage control node, the first clock signal output end, the second clock signal output end, the first level output end and the second level output end; and a voltage signal generation circuit that is coupled to the first voltage control node, the second voltage control node, the third level output end, the second level output end and a voltage signal output end, and is configured to enable the voltage signal output end to receive a signal from the second level output end under the control of the second voltage control node, and enable the voltage signal output end to receive a signal from the third level output end under the control of the first voltage control node at the fingerprint detection stage to enable the voltage signal output end to output the fingerprint detection light-emission control signal at the fingerprint detection stage.

Further, the first voltage control node control circuit includes: a first voltage control transistor, a second voltage control transistor, a third voltage control transistor, a fourth voltage control transistor, a fifth voltage control transistor, a sixth voltage control transistor, a seventh voltage control transistor, a first storage capacitor and a second storage capacitor. A gate electrode of the first voltage control transistor is coupled to the first clock signal output end, and a first electrode of the first voltage control transistor is coupled to the first start signal input end. A gate electrode of the second voltage control transistor is coupled to a second electrode of the first voltage control transistor, and a second electrode of the second voltage control transistor is coupled to the first clock signal output end. A gate electrode of the third voltage control transistor is coupled to the first clock signal output end, a first electrode of the third voltage control transistor is coupled to a first electrode of the second voltage control transistor, and a second electrode of the third voltage control transistor is coupled to a low level output end. A gate electrode of the fourth voltage control transistor is coupled to the first electrode of the third voltage control transistor, a first electrode of the fourth voltage control transistor is coupled to a high level output end, and a second electrode of the fourth voltage control transistor is coupled to the first voltage control node. A gate electrode of the fifth voltage control transistor is coupled to the second electrode of the first voltage control transistor, a first electrode of the fifth voltage control transistor is coupled to the first voltage control node, and a second electrode of the fifth voltage control transistor is coupled to the second clock signal input end. A gate electrode of the sixth voltage control transistor is coupled to the gate electrode of the fourth voltage control transistor, and a first electrode of the sixth voltage control transistor is coupled to a high level output end. A gate electrode of the seventh voltage control transistor is coupled to the second clock signal output end, a first electrode of the seventh voltage control transistor is coupled to a second electrode of the sixth voltage control transistor, and a second electrode of the seventh voltage control transistor is coupled to the gate electrode of the fifth voltage control transistor. A first end of the first storage capacitor is coupled to the gate electrode of the fifth voltage control transistor, and a second end of the first storage capacitor is coupled to the first voltage control node. A first end of the second storage capacitor is coupled to the gate electrode of the fourth voltage control transistor, and a second end of the second storage capacitor is coupled to the high level output end.

Further, the second voltage control node control circuit includes: an eighth voltage control transistor, a ninth voltage control transistor and a third storage capacitor. A gate electrode of the eighth voltage control transistor is coupled to the first voltage control node, a first electrode of the eighth voltage control transistor is coupled to the high level output end, and a second electrode of the eighth voltage control transistor is coupled to the second voltage control node. A gate electrode of the ninth voltage control transistor is coupled to the first clock signal output end, a first electrode of the ninth voltage control transistor is coupled to the second voltage control node, and a second electrode of the ninth voltage control transistor is coupled to the low level output end. A first end of the third storage capacitor is coupled to the second voltage control node, and a second end of the third storage capacitor is coupled to the second clock signal output end.

Further, the voltage signal generation circuit includes: a first voltage signal generation transistor and a second voltage signal generation transistor. A gate electrode of the first voltage signal generation transistor is coupled to the first voltage control node, a first electrode of the first voltage signal generation transistor is coupled to a square-wave voltage signal output end, and a second electrode of the first voltage signal generation transistor is coupled to the voltage signal output end. A gate electrode of the second voltage signal generation transistor is coupled to the second voltage control node, a first electrode of the second voltage signal generation transistor is coupled to the voltage signal output end, and a second electrode of the second voltage signal generation transistor is coupled to the low level output end.

Further, the light-emission control signal generation circuit includes a second start signal input end, a first clock signal output end, a second clock signal output end, a first level output end, a second level output end, a voltage signal output end and a light-emission control signal output end. The light-emission control signal generation circuit further includes: a first light-emission control node control circuit that is coupled to the second start signal input end, the first clock signal output end, the second clock signal output end, the first level output end, the second level output end and a first light-emission control node, and is configured to enable a potential of the first light-emission control node to be a first level at the fingerprint detection stage and enable the potential of the first light-emission control node to be a second level at a light-emission stage under the control of the second start signal input end, the first clock signal output end, the second clock signal output end, the first level output end and the second level output end; a second light-emission control node control circuit that is coupled to the first light-emission control node, the first clock signal output end, the second clock signal output end, the first level output end, the second level output end and a second light-emission control node, and is configured to enable a potential of the second light-emission control node to be the second level at the fingerprint detection stage and enable the potential of the second light-emission control node to be the first level at the light-emission stage under the control of the first light-emission control node, the first clock signal output end, the second clock signal output end, the first level output end and the second level output end; and a light-emission control signal generation circuit that is coupled to the first light-emission control node, the second light-emission control node, the first level output end, the voltage signal output end and the light-emission control signal output end, and is configured to enable the light-emission control signal output end to receive a signal from the first level output end under the control of the first light-emission control node at the light-emission stage, and enable the light-emission control signal output end to receive a signal from the voltage signal output end under the control of the second light-emission control node at the fingerprint detection stage to enable the light-emission control signal output end to output the fingerprint detection light-emission control signal at the fingerprint detection stage.

Further, the first light-emission control node control circuit includes: a first light-emission control transistor, a second light-emission control transistor, a third light-emission control transistor, a fourth light-emission control transistor, a fifth light-emission control transistor, a sixth light-emission control transistor, a seventh light-emission control transistor, a first capacitor and a second capacitor. A gate electrode of the first light-emission control transistor is coupled to the first clock signal output end, and a first electrode of the first light-emission control transistor is coupled to the second start signal input end. A gate electrode of the second light-emission control transistor is coupled to a second electrode of the first light-emission control transistor, and a second electrode of the second light-emission control transistor is coupled to the first clock signal output end. A gate electrode of the third light-emission control transistor is coupled to the first clock signal output end, a first electrode of the third light-emission control transistor is coupled to a first electrode of the second light-emission control transistor, and a second electrode of the third light-emission control transistor is coupled to the low level output end. A gate electrode of the fourth light-emission control transistor is coupled to the first electrode of the third light-emission control transistor, a first electrode of the fourth light-emission control transistor is coupled to the high level output end, and a second electrode of the fourth light-emission control transistor is coupled to a first light-emission control node. A gate electrode of the fifth light-emission control transistor is coupled to the second electrode of the first light-emission control transistor, a first electrode of the fifth light-emission control transistor is coupled to the first light-emission control node, and a second electrode of the fifth light-emission control transistor is coupled to the second clock signal output end. A gate electrode of the sixth light-emission control transistor is coupled to the gate electrode of the fourth light-emission control transistor, and a first electrode of the sixth light-emission control transistor is coupled to the high level output end. A gate electrode of the seventh light-emission control transistor is coupled to the second clock signal output end, a first electrode of the seventh light-emission control transistor is coupled to a second electrode of the sixth light-emission control transistor, and a second electrode of the seventh light-emission control transistor is coupled to the gate electrode of the fifth light-emission control transistor. A first end of the first capacitor is coupled to the gate electrode of the fifth light-emission control transistor, and a second end of the first capacitor is coupled to the first light-emission control node. A first end of the second capacitor is coupled to the gate electrode of the fourth light-emission control transistor, and a second end of the second capacitor is coupled to the high level output end.

Further, the second light-emission control node control circuit includes: an eighth light-emission control transistor, a ninth light-emission control transistor and a third capacitor. A gate electrode of the eighth light-emission control transistor is coupled to the first light-emission control node, a first electrode of the eighth light-emission control transistor is coupled to the high level output end, and a second electrode of the eighth light-emission control transistor is coupled to the second light-emission control node. A gate electrode of the ninth light-emission control transistor is coupled to the first clock signal output end, a first electrode of the ninth light-emission control transistor is coupled to a second light-emission control node, and a second electrode of the ninth light-emission control transistor is coupled to the low level output end. A first end of the third capacitor is coupled to the second light-emission control node, and a second end of the third capacitor is coupled to the second clock signal output end.

Further, the light-emission control signal generation circuit includes: a first light-emission control signal generation transistor and a second light-emission control signal generation transistor. A gate electrode of the first light-emission control signal generation transistor is coupled to the first light-emission control node, a first electrode of the first light-emission control signal generation transistor is coupled to the high level output end, and a second electrode of the first light-emission control signal generation transistor is coupled to the light-emission control signal output. A gate electrode of the second light-emission control signal generation transistor is coupled to the second light-emission control node, a first electrode of the second light-emission control signal generation transistor is coupled to the light-emission control signal output end, and a second electrode of the second light-emission control signal generation transistor is coupled to the voltage signal output end.

Further, the pixel driving circuit includes: a first transistor, a second transistor, a third transistor, a fourth transistor, a fifth transistor, a sixth transistor and a storage capacitor. A gate electrode of the first transistor is coupled to a resetting end, a source electrode of the first transistor is coupled to a resetting voltage signal input end, and a drain electrode of the first transistor is coupled to a first end of the storage capacitor. A gate electrode of the second transistor is coupled to a corresponding gate line, and a source electrode of the second transistor is coupled to the first end of the storage capacitor. A gate electrode of the third transistor is coupled to the first end of the storage capacitor, and a source electrode of the third transistor is coupled to a drain electrode of the second transistor. A gate electrode of the fourth transistor is coupled to a corresponding gate line, a source electrode of the fourth transistor is coupled to a corresponding data line, and a drain electrode of the fourth transistor is coupled to a second end of the storage capacitor. A gate electrode of the fifth transistor is coupled to a control signal input end, and a source electrode of the fifth transistor is coupled to the second end of the storage capacitor. A gate electrode of the sixth transistor is coupled to the light-emission control signal input end, a source electrode of the sixth transistor is coupled to an anode of an organic light-emitting diode, and a drain electrode of the sixth transistor is coupled to the source electrode of the third transistor.

In another aspect, the present disclosure provides in some embodiments a method of driving the above-mentioned display driving unit circuit, including steps of: supplying, by a light-emission control signal generation circuit, a display light-emission control signal to a pixel driving circuit at a display stage to enable a pixel in a displaying mode; and supplying, by the light-emission control signal generation circuit, a fingerprint detection light-emission control signal to the pixel driving circuit at a fingerprint detection stage to control the pixel driving circuit at the fingerprint detection stage to enable the pixel in a fingerprint detection light-emission mode.

Further, the fingerprint detection light-emission control signal is a square-wave light-emission control signal having a frequency greater than 1000 Hz. A cycle of the square-wave light-emission control signal includes a first time period in which the pixel driving circuit controls the pixel to emit light having a frequency equal to 0 Hz under the control of the square-wave light-emission control signal and a second time period in which the pixel driving circuit controls the pixel to emit light having a frequency greater than 1000 Hz under the control of the square-wave light-emission control signal.

In yet another aspect, the present disclosure provides in some embodiments a display driving circuit including a plurality of light-emission control lines and a plurality of display driving unit circuits. Each of the plurality of display driving unit circuit includes a pixel driving circuit and a light-emission control signal generation circuit. The light-emission control signal generation circuit is coupled to a light-emission control signal input end of the pixel driving circuit and is configured to supply a display light-emission control signal to the pixel driving circuit at a display stage to enable a pixel in a displaying mode and supply a fingerprint detection light-emission control signal to the pixel driving circuit at a fingerprint detection stage to enable the pixel in a fingerprint detection light-emission mode. Each of the plurality of light-emission control lines is coupled to a light-emission control signal output end of one pixel driving circuit of the plurality of display driving unit circuits. Display stages for different rows of pixels do not overlap each other, and fingerprint detection stages for different rows of pixels do not overlap each other.

In still yet another aspect, the present disclosure provides in some embodiments a display device including the above-mentioned display driving circuit and photovoltaic conversion elements. Each photovoltaic conversion element is arranged at a position corresponding to a non-light-emission region, coupled to a fingerprint current read line, and configured to convert a received optical signal into a fingerprint current signal and output the fingerprint current signal via the fingerprint current read line.

Further, each of the photovoltaic conversion elements is between two adjacent pixels in a row direction.

Further, each photovoltaic conversion element includes a photo diode having an anode coupled to a fixed electrically-conductive electrode and a cathode coupled to the fingerprint current read line.

DETAILED DESCRIPTION

In order to make the objects, the technical solutions and the advantages of the present disclosure clear and complete, the present disclosure will be described hereinafter in a clear and complete manner in conjunction with the drawings and embodiments. Evidently, the following embodiments merely relate to a part of, rather than all of, the embodiments of the present disclosure, and based on these embodiments, a person skilled in the art may, without any creative effort, obtain other embodiments, which also fall within the scope of the present disclosure.

Figure 1:
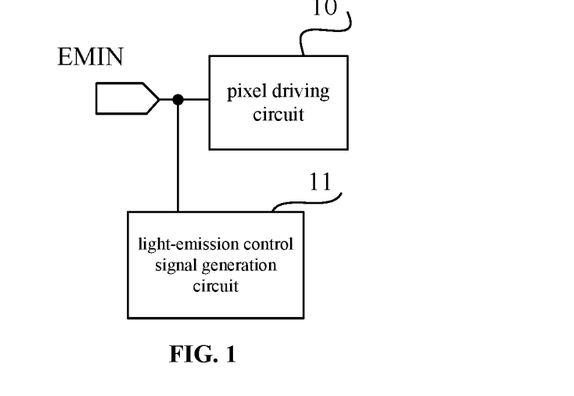
FIG. 1 is a schematic view showing a display driving unit circuit according to some embodiments of the present disclosure.

As shown in FIG. 1, the present disclosure provides in some embodiments a display driving unit circuit, which includes a pixel driving circuit 10 configured to drive a pixel to emit light and a light-emission control signal generation circuit 11. The light-emission control signal generation circuit 11 is coupled to a light-emission control signal input end EMIN of the pixel driving circuit 10 and configured to, at a display stage, supply a display light-emission control signal to the pixel driving circuit 10 and, at a fingerprint detection stage, supply a fingerprint detection light-emission control signal to the pixel driving circuit 10 to control the pixel driving circuit 10 to enable the pixel to emit light in a fingerprint detection light-emission mode at the fingerprint detection stage. The display stage and the fingerprint detection stage are different time periods.

Figure 8:
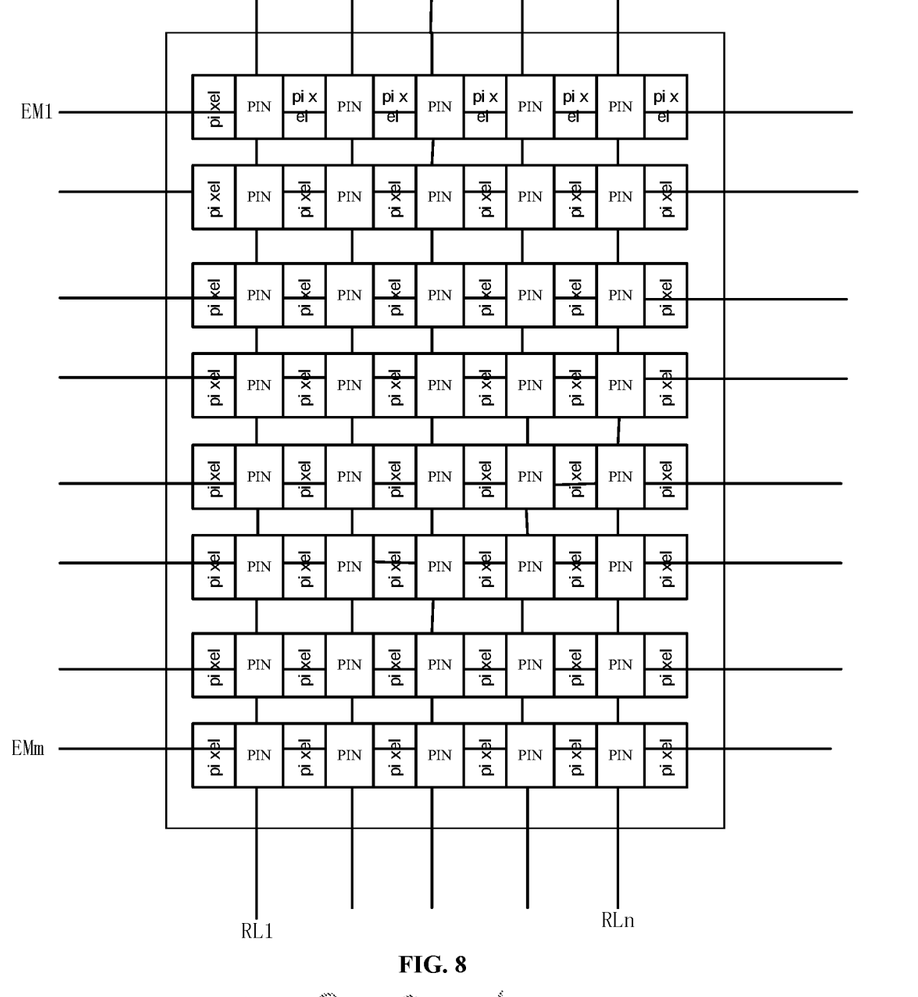
FIG. 8 is a planar view showing photosensitive PIN junctions arranged between pixels according to some embodiments of the present disclosure.
Figure 9:
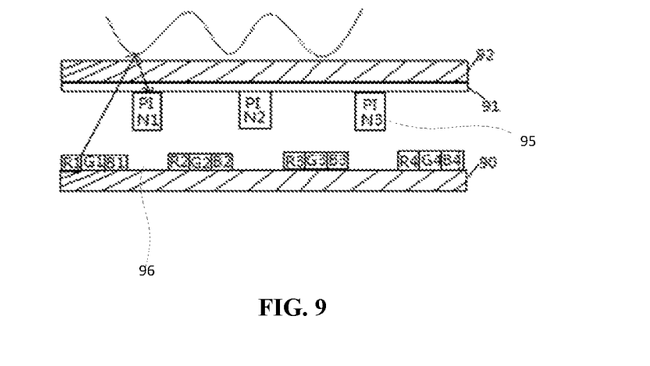
FIG. 9 is a schematic view showing the photosensitive PIN junctions arranged on a glass encapsulation substrate at positions corresponding non-light-emission regions according to some embodiments of the present disclosure.

As shown in FIG. 8 and FIG. 9, the display driving unit circuit further includes photovoltaic conversion elements 95. The photovoltaic conversion elements 95 may be provided to detect a fingerprint. Each photovoltaic conversion element 95 may be arranged at a position corresponding to a non-light-emission region 96 and between two adjacent pixels in the row, coupled to a fingerprint current read line, and configured to convert a received optical signal into a corresponding fingerprint current signal which is then outputted via the fingerprint current read line. In one embodiment shown in FIG. 8 and FIG. 9, the photovoltaic conversion element 95 may include a photo diode, for example, a photosensitive PIN junction may be arranged between two adjacent pixels.

According to the display driving unit circuit in the embodiments of the present disclosure, the light-emission control signal generation circuit supplies the fingerprint detection light-emission control signal to the corresponding pixel driving circuit at the fingerprint detection stage, and the photovoltaic conversion element outputs a photocurrent signal at the fingerprint detection stage, so as to perform the fingerprint detection. As a result, it is possible for the display driving unit circuit in the embodiments of the present disclosure to perform the fingerprint detection without any additional switching transistor, thereby improving the accuracy of the fingerprint detection as well as the aperture ratio of the display panel.

In practice, there may be a plurality of photovoltaic conversion elements each arranged between two adjacent pixels in the row. Alternatively, the photovoltaic conversion elements may be arranged at intervals based on the requirement on the fingerprint detection accuracy.

In implementations, the photovoltaic conversion element may be nontransparent, so it may be arranged at a position corresponding to the non-light-emission region so as not to adversely affect the normal display.

For the display driving unit circuit in FIG. 1, at the fingerprint detection stage, the light-emission control signal generation circuit 11 supplies the fingerprint detection light-emission control signal to the pixel driving circuit 10 to control the pixel driving circuit 10 to enable the pixel to emit light in the fingerprint detection light-emission mode to enable the light from the pixel not to be perceived by human eyes at the fingerprint detection stage (e.g., the fingerprint detection light-emission control signal may be a high-frequency square-wave light-emission control signal so that the light form the pixel may not be perceived by the human eyes at the fingerprint detection stage). In addition, light emitted by a light-emitting element of each pixel in the row (e.g., an Organic Light-Emitting Diode (OLED)) at the fingerprint detection stage is different from light emitted by the light-emitting element of each pixel in the row at the display stage. For example, at the display stage the light-emitting element of each pixel in the row may emit light stably and continuously (i.e., displaying mode), while at the fingerprint detection stage an optical signal received by the photovoltaic conversion element may be a high-frequency modulated optical signal, so that the photovoltaic conversion element may convert the received high-frequency modulated optical signal into a high-frequency modulated electric signal. Then, the high-frequency modulated optical signal may be demodulated through an Integrated Circuit (IC), so as to acquire a signal carrying fingerprint information.

For example, in one embodiment, the light emitted from the pixel in the displaying mode is of a first frequency, the light emitted from the pixel in the fingerprint detection light-emission mode is of a second frequency, and the first frequency is different from the second frequency. Further, the first frequency is less than the second frequency. The first frequency is a frequency of light when the pixel emits light stably and continuously, and the second frequency is a frequency of light when the light from the pixel may not be perceived by the human eyes at the fingerprint detection stage. In one embodiment, the first frequency is substantially equal to 0 Hz, and the second frequency is greater than 1000 Hz.

In practice, as shown in FIG. 8, the photovoltaic conversion element may be a photo diode, and a photosensitive PIN junction may be arranged between two adjacent pixels. Through supplying the light-emission control signal line by line, the fingerprint current read line may receive PIN light response signals with respect to the light from the pixels in different rows.

In a possible embodiment of the present disclosure, the fingerprint detection light-emission control signal may be a square-wave light-emission control signal having a frequency greater than 1000 Hz. In this way, the light from the pixel in the corresponding row may not be perceived by the human eyes at the fingerprint detection stage, so as to prevent the normal display from being adversely affected. In addition, at the fingerprint detection stage, the optical signal from each pixel is a square-wave modulated optical signal, the photovoltaic conversion element may convert the square-wave modulated optical signal into a square-wave modulated fingerprint current, so it is possible to differentiate the current acquired through the conversion of photovoltaic conversion element from a fingerprint current.

A cycle of the square-wave light-emission control signal includes a first time period in which the pixel driving circuit controls the row of pixels to emit light under the control of the square-wave light-emission control signal and a second time period in which the pixel driving circuit controls the pixel not to emit light under the control of the square-wave light-emission control signal.

Figure 2:
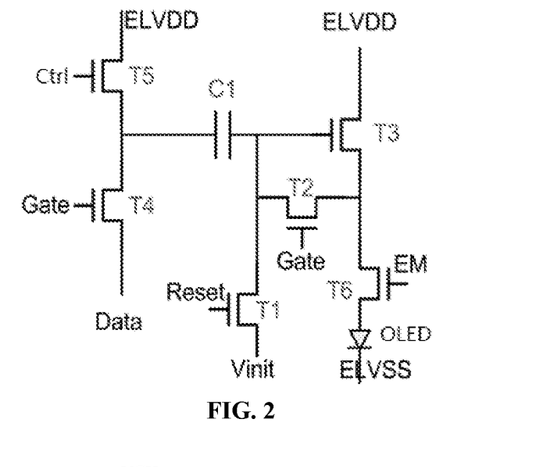
FIG. 2 is a circuit diagram of a pixel driving circuit of the display driving unit circuit according to some embodiments of the present disclosure.

For example, as shown in FIG. 2, an example of the pixel driving circuit 10 includes a light-emission control signal input end EMIN, a control signal input end Ctrl, a resetting end Reset, a resetting voltage signal input end for inputting a resetting voltage signal Vinit, a first transistor T1, a second transistor T2, a third transistor T3, a fourth transistor T4, a fifth transistor T5, a sixth transistor T6 and a storage capacitor C1.

A gate electrode of T1 is coupled to the resetting end Reset, a source electrode thereof is coupled to the resetting voltage signal input end for inputting a resetting voltage signal Vinit, and a drain electrode thereof is coupled to a first end of the storage capacitor C1.

A gate electrode of T2 is coupled to a corresponding gate line Gate, and a source electrode thereof is coupled to the first end of the storage capacitor C1.

A gate electrode of T3 is coupled to the first end of the storage capacitor C1, and a source electrode thereof is coupled to a drain electrode of T2.

A gate electrode of T4 is coupled to a corresponding gate line Gate, a source electrode thereof is coupled to a corresponding data line Data, and a drain electrode thereof is coupled to a second end of the storage capacitor C1.

A gate electrode of T5 is coupled to the control signal input end Ctrl, and a source electrode thereof is coupled to the second end of the storage capacitor C1.

A gate electrode of T6 is coupled to the light-emission control signal input end EMIN, a source electrode thereof is coupled to an anode of an OLED, and a drain electrode thereof is coupled to the source electrode of T3.

In FIG. 2, ELVDD represents a high level, and ELVSS represents a low level.

In FIG. 2, T6 is an n-type transistor. At this time, at the display stage for the pixel in a corresponding row, a light-emission control signal EM from the light-emission control signal input end EMIN is of a high level, so OLED may emit light. At the fingerprint detection stage for the pixel in a corresponding row, EM is a square-wave light-emission control signal. In case that the square-wave light-emission control signal is at a high level, OLED may emit light, and in case that the square-wave light-emission control signal is at a low level, OLED may not emit light.

In practice, as shown in FIG. 2A, T6 may also be a p-type transistor. At the display stage for the pixel in a corresponding row, EM is at a low level, so OLED may emit light. At the fingerprint detection stage for the pixel in a corresponding row, EM is a square-wave light-emission control signal. In case that the square-wave light-emission control signal is at a low level, OLED may emit light, and in case that the square-wave light-emission control signal is at a high level, OLED may not emit light.

In a possible embodiment of the present disclosure, the display driving unit circuit further includes a voltage signal generation circuit coupled to the light-emission control signal generation circuit and configured to supply the fingerprint detection light-emission control signal to a light-emission control signal output end of the light-emission control signal generation circuit at the fingerprint detection stage.

In a display driving unit circuit in the related art, a low level output end coupled to a pull-down transistor of the light-emission control signal generation circuit may output a low level within all time periods. However, in order to enable the light-emission control signal generation circuit to output the fingerprint detection light-emission control signal at the fingerprint detection stage for the pixel in a corresponding row, the display driving unit circuit in the embodiments of the present disclosure may include the voltage signal generation circuit, so as to supply the fingerprint detection light-emission control signal to the light-emission control signal generation circuit at the fingerprint detection stage.

In a possible embodiment of the present disclosure, the voltage signal generation circuit includes a first start signal input end, a first clock signal output end, a second clock signal output end, a first level output end, a second level output end, a third level output end and a voltage signal output end. The voltage signal generation circuit further includes: a first voltage control node control circuit, a second voltage control node control circuit and a voltage signal generation circuit.

The first voltage control node control circuit is coupled to the first start signal input end, the first clock signal output end, the second clock signal output end, the first level output end, the second level output end and a first voltage control node. The first voltage control node control circuit is to enable a potential of the first voltage control node to be a first level at a first start stage and enable the potential of the first voltage control node to be a second level at the fingerprint detection stage under the control of a first start signal, a first clock signal, a second clock signal, the first level and the second level.

The second voltage control node control circuit is coupled to the first voltage control node, the first clock signal output end, the second clock signal output end, the first level output end, the second level output end and a second voltage control node. The second voltage control node control circuit is to enable a potential of the second voltage control node to be the second level at the first start stage and enable the potential of the second voltage control node to be the first level at the fingerprint detection stage under the control of the first voltage control node, the first clock signal, the second clock signal, the first level and the second level.

The voltage signal generation circuit is coupled to the first voltage control node, the second voltage control node, the third level output end, the second level output end and a voltage signal output end. The voltage signal generation circuit is to enable the voltage signal output end to be coupled to the second level output end under the control of the second voltage control node at the first start stage, and enable the voltage signal output end to be coupled to the third level output end under the control of the first voltage control node at the fingerprint detection stage, so as to enable the voltage signal output end to output the fingerprint detection light-emission control signal at the fingerprint detection stage, thereby enabling the pixels to emit light row by row.

Figure 3:
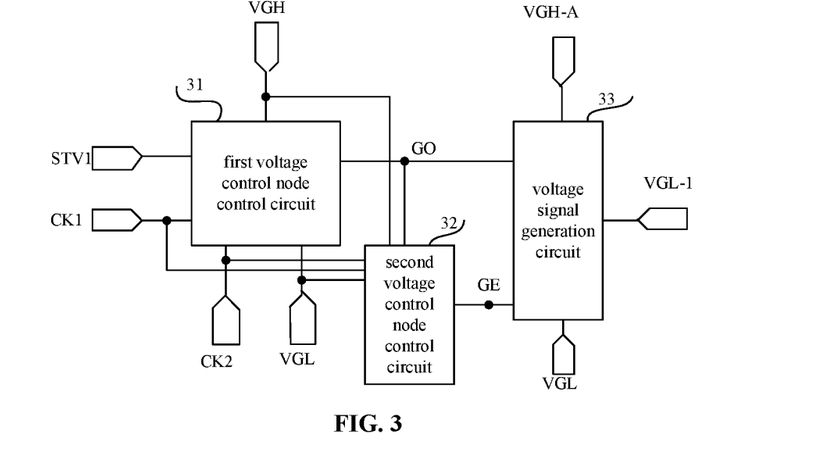
FIG. 3 is a schematic view showing a voltage signal generation circuit of the display driving unit circuit according to some embodiments of the present disclosure.

As show in FIG. 3, the voltage signal generation circuit includes a first start signal input end STV1, a first clock signal output end CK1, a second clock signal output end CK2, a high level output end for outputting a high level VGH, a low level output end for outputting a low level VGL, a square-wave voltage signal output end for outputting a square-wave voltage signal VGH-A, and a voltage signal output end for outputting a voltage signal VGL-1.

The voltage signal generation circuit further includes: a first voltage control node control circuit 31, a second voltage control node control circuit 32 and a voltage signal generation circuit 33.

The first voltage control node control circuit 31 is coupled to the first start signal input end STV1, the first clock signal output end CK1, the second clock signal output end CK2, the high level output end for outputting the high level VGH, the low level output end for outputting the low level VGL and a first voltage control node GO. The first voltage control node control circuit 31 is to enable a potential of the first voltage control node GO to be a high level at a first start stage TS1 and enable the potential of the first voltage control node GO to be a low level at the fingerprint detection stage TF under the control of a first start signal inputted by STV1, a first clock signal outputted by CK1, a second clock signal outputted by CK2, the high level VGH and the low level VGL (FIG. 4 shows a timing diagram of the potential of GO).

The second voltage control node control circuit 32 is coupled to the first voltage control node GO, the first clock signal output end CK1, the second clock signal output end CK2, the high level output end for outputting the high level VGH, the low level output end for outputting the low level VGL and a second voltage control node GE. The second voltage control node control circuit 32 is to enable a potential of the second voltage control node GE to be a low level at the first start stage TS1 and enable the potential of the second voltage control node GE to be a high level at the fingerprint detection stage TF under the control of the first voltage control node GO, the first clock signal outputted by CK1, the second clock signal outputted by CK2, the high level VGH and the low level VGL.

The voltage signal generation circuit 33 is coupled to the first voltage control node GO, the second voltage control node GE, the square-wave voltage signal output end for outputting the square-wave voltage signal VGH-A, the low level output end for outputting the low level VGL and the voltage signal output end for outputting the voltage signal VGL-1. The voltage signal generation circuit 33 is to enable the voltage signal output end to be electrically coupled to the low level output end under the control of the second voltage control node GE at the first start stage TS1, and enable the voltage signal output end to be electrically coupled to the third level output end under the control of the first voltage control node GO at the fingerprint detection stage to enable the voltage signal output end to output the fingerprint detection light-emission control signal at the fingerprint detection stage.

Figure 4:
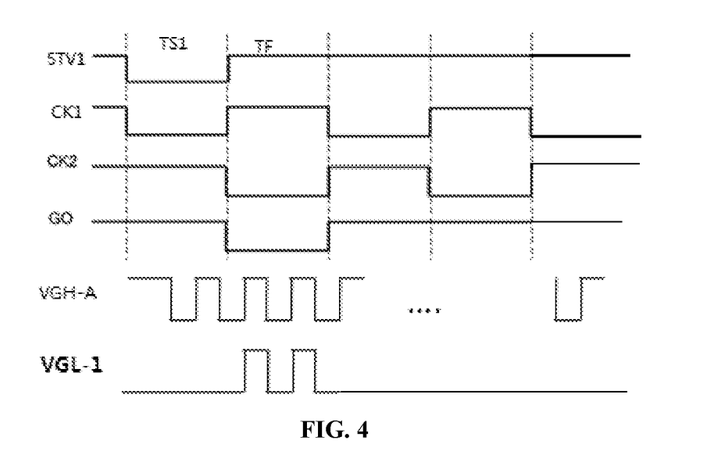
FIG. 4 is a timing diagram of the voltage signal generation circuit in FIG. 3.

In practice, as shown in FIG. 4, the square-wave voltage signal VGH-A is acquired by superposing a square-wave level signal to the original high level VGH.

As shown in FIG. 4, during the operation of the voltage signal generation circuit in FIG. 3, at the first start stage TS1, STV1 and CK1 each output a low level, CK2 outputs a high level, the first voltage control node control circuit 31 controls the potential of GO to be a high level, the second voltage control node control circuit 32 controls the potential of GE to be a low level, and the voltage signal generation circuit 33 controls the voltage signal output end to be electrically coupled to the low level output end, so VGL-1 is a low level. At the fingerprint detection stage TF, STV1 and CK1 each output a high level, CK2 outputs a low level, the first voltage control node control circuit 31 controls the potential of GO to be a low level, the second voltage control node control circuit 32 controls the potential of GE to be a high level, and the voltage signal generation circuit 33 controls the voltage signal output end to receive VGH-A, so VGL-1 is a square-wave voltage signal.

Figure 5:
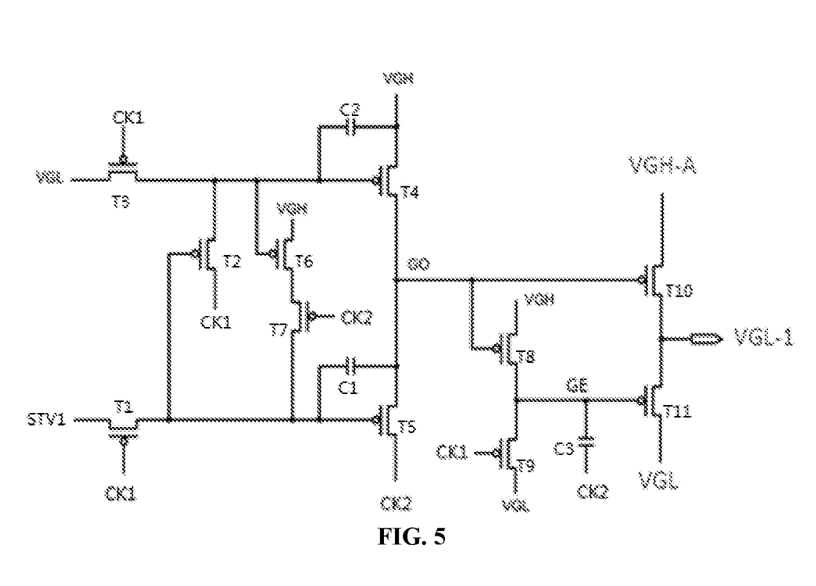
FIG. 5 is another circuit diagram of the voltage signal generation circuit of the display driving unit circuit according to some embodiments of the present disclosure.

As shown in FIG. 5, in a specific embodiment of the present disclosure, the first voltage control node control circuit includes: a first voltage control transistor T1, a second voltage control transistor T2, a third voltage control transistor T3, a fourth voltage control transistor T4, a fifth voltage control transistor T5, a sixth voltage control transistor T6, a seventh voltage control transistor T7, a first storage capacitor C1 and a second storage capacitor C2.

A gate electrode of the first voltage control transistor T1 is coupled to the first clock signal output end CK1, and a first electrode of the first voltage control transistor T1 is coupled to the first start signal input end STV1.

A gate electrode of the second voltage control transistor T2 is coupled to a second electrode of the first voltage control transistor T1, and a second electrode of the second voltage control transistor T2 is coupled to the first clock signal output end CK1.

A gate electrode of the third voltage control transistor T3 is coupled to the first clock signal output end CK1, a first electrode of the third voltage control transistor T3 is coupled to a first electrode of the second voltage control transistor T2, and a second electrode of the third voltage control transistor T3 is coupled to the low level output end for outputting the low level VGL.

A gate electrode of the fourth voltage control transistor T4 is coupled to the first electrode of the third voltage control transistor T3, a first electrode of the fourth voltage control transistor T4 is coupled to the high level output end for outputting the high level VGH, and a second electrode of the fourth voltage control transistor T4 is coupled to the first voltage control node GO.

A gate electrode of the fifth voltage control transistor T5 is coupled to the second electrode of the first voltage control transistor T1, a first electrode of the fifth voltage control transistor T5 is coupled to the first voltage control node GO, and a second electrode of the fifth voltage control transistor T5 is coupled to the second clock signal input end CK2.

A gate electrode of the sixth voltage control transistor T6 is coupled to the gate electrode of the fourth voltage control transistor T4, and a first electrode of the sixth voltage control transistor T6 is coupled to the high level output end for outputting the high level VGH.

A gate electrode of the seventh voltage control transistor T7 is coupled to the second clock signal output end CK2, a first electrode of the seventh voltage control transistor T7 is coupled to a second electrode of the sixth voltage control transistor T6, and a second electrode of the seventh voltage control transistor T7 is coupled to the gate electrode of the fifth voltage control transistor T5.

A first end of the first storage capacitor C1 is coupled to the gate electrode of the fifth voltage control transistor T5, and a second end of the first storage capacitor C1 is coupled to the first voltage control node GO.

A first end of the second storage capacitor C2 is coupled to the gate electrode of the fourth voltage control transistor T4, and a second end of the second storage capacitor C2 is coupled to the high level output end for outputting the high level VGH.

The second voltage control node control circuit includes: an eighth voltage control transistor T8, a ninth voltage control transistor T9, and a third storage capacitor C3.

A gate electrode of the eighth voltage control transistor T8 is coupled to the first voltage control node GO, a first electrode of the eighth voltage control transistor T8 is coupled to the high level output end for outputting the high level VGH, and a second electrode of the eighth voltage control transistor T8 is coupled to the second voltage control node GE.

A gate electrode of the ninth voltage control transistor T9 is coupled to the first clock signal output end CK1, a first electrode of the ninth voltage control transistor T9 is coupled to the second voltage control node GE, and a second electrode of the ninth voltage control transistor T9 is coupled to the low level output end for outputting the low level VGL.

A first end of the third storage capacitor C3 is coupled to the second voltage control node GE, and a second end of the third storage capacitor C3 is coupled to the second clock signal output end CK2.

The voltage signal generation circuit includes: a first voltage signal generation transistor T10 and a second voltage signal generation transistor T11.

A gate electrode of the first voltage signal generation transistor T10 is coupled to the first voltage control node GO, a first electrode of the first voltage signal generation transistor T10 is coupled to the square-wave voltage signal output end for outputting the square-wave voltage signal VGH-A, and a second electrode of the first voltage signal generation transistor T10 is coupled to the voltage signal output end for outputting the voltage signal VGL-1.

A gate electrode of the second voltage signal generation transistor T11 is coupled to the second voltage control node GE, a first electrode of the second voltage signal generation transistor T11 is coupled to the voltage signal output end VGL-1, and a second electrode of the second voltage signal generation transistor T11 is coupled to the low level output end for outputting the low level VGL.

In FIG. 5, all the transistors are p-type transistors. In case that the first electrode is a drain electrode, the second electrode is a source electrode, and in case that the first electrode is a source electrode, the second electrode is a drain electrode. In practice, the transistors in FIG. 5 may also be n-type transistors (i.e., the types of the transistors will not be particularly defined herein), and then, it is merely necessary to change levels of the corresponding control signals.

As shown in FIG. 4, during the operation of the voltage signal generation circuit in FIG. 5, at the first start stage TS1, STV1 and CK1 each output a low level and CK2 outputs a high level, so T3 and T1 are turned on, so as to enable STV1 to be coupled to the gate electrode of T2 and the gate electrode of T5, thereby to write VGL into the gate electrode of T4 and turn on T2 and T5. T4 is turned on, and the potential of GO is at a high level. T10 is turned off, and T9 is turned on under the control of CK1, so as to enable the potential of GE to be at a low level and turn on T11, thereby to enable VGL-1 to be at a low level. At the fingerprint detection stage TF, STV1 and CK1 each output a high level, and CK2 outputs a low level, so T1, T3 and T9 are turned off, and a potential of the gate electrode of T5 is maintained as a low level. GO is coupled to CK2, the potential of GO is at a low level, and T8 is turned on, so the potential of GE is at a high level. T11 is turned off, and T10 is turned on, so as to enable the voltage signal output end to receive VGH-A, thereby to enable VGL-1 to be a square-wave voltage signal. As shown in FIG. 4, in stages other than the fingerprint detection stage TF, VGL-1 is at a low level.

During the operation of the voltage signal generation circuit in FIG. 5, VGL may be at a low level all the time (not shown FIG. 4), and at the fingerprint detection stage TF, VGL-1 is a square-wave voltage signal, i.e., VGL is different from VGL-1. In practice, the potential of VGL may also be identical to that of VGL-1.

To be specific, the light-emission control signal generation circuit includes a second start signal input end, a first clock signal output end, a second clock signal output end, a first level output end, a second level output end, a voltage signal output end and a light-emission control signal output end. The light-emission control signal generation circuit further includes a first light-emission control node control circuit, a second light-emission control node control circuit and a light-emission control signal generation circuit.

The first light-emission control node control circuit is coupled to the second start signal input end, the first clock signal output end, the second clock signal output end, the first level output end, the second level output end and a first light-emission control node. The first light-emission control node control circuit is to enable a potential of the first light-emission control node to be a first level at a second start stage and the fingerprint detection stage and enable the potential of the first light-emission control node to be a second level at a light-emission stage under the control of a second start signal, a first clock signal, a second clock signal, the first level and the second level.

The second light-emission control node control circuit is coupled to the first light-emission control node, the first clock signal output end, the second clock signal output end, the first level output end, the second level output end and a second light-emission control node. The second light-emission control node control circuit is configured to enable a potential of the second light-emission control node to be the second level at the second start stage and the fingerprint detection stage and enable the potential of the second light-emission control node to be the first level at the light-emission stage under the control of the first light-emission control node, the first clock signal, the second clock signal, the first level and the second level.

The light-emission control signal generation circuit is coupled to the first light-emission control node, the second light-emission control node, the first level output end, the voltage signal output end and the light-emission control signal output end. The light-emission control signal generation circuit is to enable the light-emission control signal output end to be coupled to the first level output end under the control of the first light-emission control node at the light-emission stage, and enable the light-emission control signal output end to be coupled to the voltage signal output end under the control of the second light-emission control node at the fingerprint detection stage, so as to enable the light-emission control signal output end to output the fingerprint detection light-emission control signal at the fingerprint detection stage.

In practice, the voltage signal generation circuit may be of a structure identical to the light-emission control signal generation circuit, merely with differences in the timing of the control signals. In a possible embodiment of the present disclosure, the voltage signal generation circuit may also be of a structure different from the light-emission control signal generation circuit.

Figure 6:
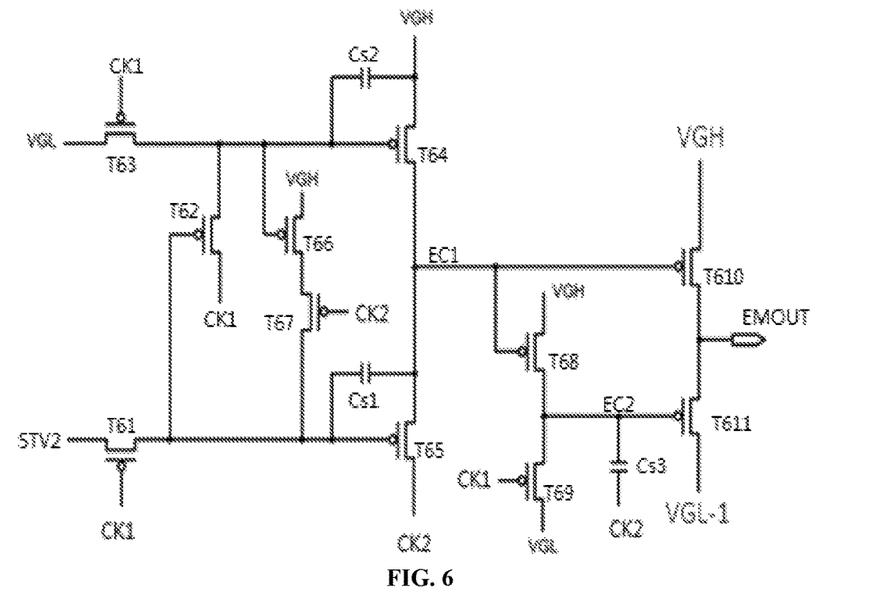
FIG. 6 is a circuit diagram of a light-emission control signal generation circuit of the display driving unit circuit according to some embodiments of the present disclosure.

As shown in FIG. 6, in a specific embodiment of the present disclosure, the first light-emission control node control circuit includes: a first light-emission control transistor T61, a second light-emission control transistor T62, a third light-emission control transistor T63, a fourth light-emission control transistor T64, a fifth light-emission control transistor T65, a sixth light-emission control transistor T66, a seventh light-emission control transistor T67, a first capacitor Cs1 and a second capacitor Cs2.

A gate electrode of the first light-emission control transistor T61 is coupled to the first clock signal output end CK1, and a first electrode of the first light-emission control transistor T61 is coupled to the second start signal input end STV2.

A gate electrode of the second light-emission control transistor T62 is coupled to a second electrode of the first light-emission control transistor T61, and a second electrode of the second light-emission control transistor T62 is coupled to the first clock signal output end CK1.

A gate electrode of the third light-emission control transistor T63 is coupled to the first clock signal output end CK1, a first electrode of the third light-emission control transistor T63 is coupled to a first electrode of the second light-emission control transistor T62, and a second electrode of the third light-emission control transistor T63 is coupled to the low level output end for outputting the low level VGL.

A gate electrode of the fourth light-emission control transistor T64 is coupled to the first electrode of the third light-emission control transistor T63, a first electrode of the fourth light-emission control transistor T64 is coupled to the high level output end for outputting the high level VGH, and a second electrode of the fourth light-emission control transistor T64 is coupled to a first light-emission control node EC1.

A gate electrode of the fifth light-emission control transistor T65 is coupled to the second electrode of the first light-emission control transistor T61, a first electrode of the fifth light-emission control transistor T65 is coupled to the first light-emission control node EC1, and a second electrode of the fifth light-emission control transistor T65 is coupled to the second clock signal output end CK2.

A gate electrode of sixth light-emission control transistor T66 is coupled to the gate electrode of the fourth light-emission control transistor T64, and a first electrode of the sixth light-emission control transistor T66 is coupled to the high level output end for outputting the high level VGH.

A gate electrode of the seventh light-emission control transistor T67 is coupled to the second clock signal output end CK2, a first electrode of the seventh light-emission control transistor T67 is coupled to a second electrode of the sixth light-emission control transistor T66, and a second electrode of the seventh light-emission control transistor T67 is coupled to the gate electrode of the fifth light-emission control transistor T65.

A first end of the first capacitor Cs1 is coupled to the gate electrode of the fifth light-emission control transistor T65, and a second end of the first capacitor Cs1 is coupled to the first light-emission control node EC1.

A first end of the second capacitor Cs2 is coupled to the gate electrode of the fourth light-emission control transistor T64, and a second end of the second capacitor Cs2 is coupled to the high level output end for outputting the high level VGH.

The second light-emission control node control circuit includes: an eighth light-emission control transistor T68, a ninth light-emission control transistor T69, and a third capacitor Cs3.

A gate electrode of the eighth light-emission control transistor T68 is coupled to the first light-emission control node EC1, a first electrode of the eighth light-emission control transistor T68 is coupled to the high level output end for outputting the high level VGH, and a second electrode of the eighth light-emission control transistor T68 is coupled to the second light-emission control node EC2.

A gate electrode of the ninth light-emission control transistor T69 is coupled to the first clock signal output end CK1, a first electrode of the ninth light-emission control transistor T69 is coupled to a second light-emission control node EC2, and a second electrode of the ninth light-emission control transistor T69 is coupled to the low level output end for outputting the low level VGL.

A first end of the third capacitor Cs3 is coupled to the second light-emission control node EC2, and a second end of the third capacitor Cs3 is coupled to the second clock signal output end CK2.

The light-emission control signal generation circuit includes: a first light-emission control signal generation transistor T610, and a second light-emission control signal generation transistor T611.

A gate electrode of the first light-emission control signal generation transistor T610 is coupled to the first light-emission control node EC1, a first electrode of the first light-emission control signal generation transistor T610 is coupled to the high level output end for outputting the high level VGH, and a second electrode of the first light-emission control signal generation transistor T610 is coupled to the light-emission control signal output EMOUT.

A gate electrode of the second light-emission control signal generation transistor T611 is coupled to the second light-emission control node EC2, a first electrode of the second light-emission control signal generation transistor T611 is coupled to the light-emission control signal output end EMOUT, and a second electrode of the second light-emission control signal generation transistor T611 is coupled to the voltage signal output end for outputting the voltage signal VGL-1.

Figure 7:
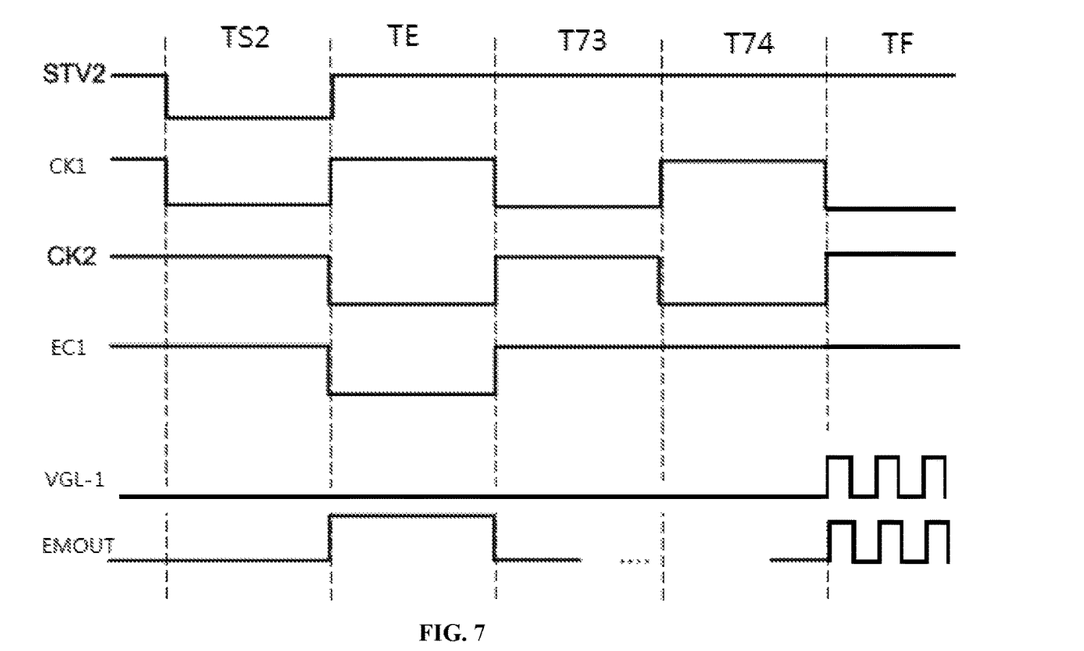
FIG. 7 is a timing diagram of the light-emission control signal generation circuit of the display driving unit circuit according to some embodiments of the present disclosure.

As shown in FIG. 7, the display stage for the pixel in a corresponding row may include four stages, i.e., TS2, TE, T73 and T74.

At the second start stage TS2, VGL-1 is a low level, STV2 inputs a low level, CK1 outputs a low level, and CK2 outputs a high level, so T61 and T63 are turned on. VGL is written into the gate electrode of T64, and STV2 is coupled to the gate electrode of T65, so T64 and T65 are turned on, and the potential of EC1 is at a high level. T69 is turned on, so the potential of EC2 is at a low level. T610 is turned off and T611 is turned on, so EMOUT receives VGL-1 and outputs a low level.

At the light-emission stage TE, VGL-1 is a low level, STV2 inputs a high level, CK1 outputs a high level, and CK2 outputs a low level, so T61, T63 and T69 are turned on. The potential of the gate electrode of T65 is maintained at a low level, T65 is turned on, and EC1 is coupled to CK1, so the potential of EC1 is at a low level. T68 is turned on, so EC2 receives VGH. T611 is turned off, and T610 is turned on, so EMOUT outputs the high level VGH.

At the third stage T73, VGL-1 is a low level, STV2 inputs a high level, CK1 outputs a low level, and CK2 outputs a high level, so T61 and T63 are turned on. VGL is written into the gate electrode of T64, STV2 is coupled to the gate electrode of T65, and the potential of the gate electrode of T65 is a high level, so T64 is turned on and T65 is turned off. The potential of EC1 is at a high level. T69 is turned on, so the potential of EC2 is a low level. T610 is turned on, and T611 is turned on, so EMOUT receives VGL-1 and outputs a low level.

At the fourth stage T74, VGL-1 is a low level, STV2 inputs a high level, CK1 outputs a high level and CK2 outputs a low level, so T61, T63 and T69 are turned off and the potential of G0 is maintained as a high level. Because CK2 outputs a low level, T610 is turned off, and EC2 is pulled down by Cs3 to a potential lower than the potential of T73. T611 is turned on, so EMOUT receives VGL-1 and outputs a low level.

At the fingerprint detection stage TF, VGL-1 is a square-wave voltage signal, STV2 inputs a high level, CK1 outputs a low level and CK2 outputs a high level, so T61, T63 and T69 are turned on. VGL is written into the gate electrode of T64, STV2 is coupled to the gate electrode of T65, and the potential of the gate electrode of T65 is at a high level, so T64 is turned on, T65 is turned off, and the potential of EC1 is at a high level. T69 is turned on, so the potential of EC2 is at a low level. T610 is turned off, and T611 is turned on, so EMOUT receives VGL-1 and outputs a square-wave voltage signal. In other words, at the fingerprint detection stage, the fingerprint detection light-emission control signal outputted by EMOUT is a square-wave light-emission control signal which has a frequency greater than 1000 Hz.

As shown in FIG. 7, at the fingerprint detection stage TF, VGL-1 is the square-wave voltage signal, and EM outputs the square-wave voltage signal, so a requirement on outputting the light-emission control signal may be met.

During the implementation, the photovoltaic conversion element may include a photo diode. An anode of the photo diode is coupled to a fixed electrically-conductive electrode, and a cathode of the photo diode is coupled to the fingerprint current read line.

As shown in FIG. 8, a photosensitive PIN junction is arranged between two adjacent pixels. The pixels in each row are coupled to the same light-emission control line, and the photosensitive PIN junctions in each column are coupled to the same fingerprint current read line. Through supplying the light-emission control signal row by row, the fingerprint current read line may receive a PIN optical response signal with respect to the light from the pixels in the same row. Then, the received PIN optical response signal may be demodulated through an IC in accordance with a modulation frequency (which may be a modulation frequency of VGH-A at the fingerprint detection stage TF), so as to acquire an electric signal containing fingerprint information. The fingerprint information in a Y-axis direction may be determined through the scanning operation on the light-emission control line, and the fingerprint information in an X-axis direction may be determined in accordance with the information from the fingerprint current read line. The modulation operation is used mainly for the reason that the demodulated signal merely reflects the information about the modulated signal and the detection result may not be adversely affected by light from the pixels in other rows.

In FIG. 8, EM1 represents a first light-emission control line, EMm represents an $m^{th}$ light-emission control line, RL1 represents a first fingerprint current read line, RLn represents an $n^{th}$ fingerprint current read line, where m and n are each a positive integer. The photosensitive PIN junctions in one column are coupled to the same fingerprint current read line, and the pixels in one row are coupled to the same light-emission control line.

In practice, as shown in FIG. 9, four pixels are arranged adjacent to each other on a back glass substrate 90. A first pixel includes from left to right a first red subpixel R1, a first green subpixel G1 and a first blue subpixel B1. A second pixel includes from left to right a second red subpixel R2, a second green subpixel G2 and a second blue subpixel B2. A third pixel includes from left to right a third red subpixel R3, a third green subpixel G3 and a third blue subpixel B3. A fourth pixel includes from left to right a fourth red subpixel R4, a fourth green subpixel G4 and a fourth blue subpixel B4.

A fixed electrode 91 made of indium tin oxide (ITO) is arranged on a glass encapsulation substrate 92, and an insulation layer is arranged between the fixed electrode 91 and the back glass substrate 90. In the embodiments of the present disclosure, the photosensitive PIN junction is formed on the glass encapsulation substrate 92, at a position corresponding to a non-light-emission region and between two adjacent pixels. An anode of each photosensitive PIN junction is coupled to the fixed electrode 91, and a cathode of each photosensitive PIN junction is coupled to a corresponding fingerprint current read line. In FIG. 9, PIN1 represents a first photosensitive PIN junction, PIN2 represents a second photosensitive PIN junction, and PIN3 represents a third photosensitive PIN junction.

In FIG. 9, the light from each pixel is reflected by a finger toward the photosensitive PIN junction. At the fingerprint detection stage, there may be a difference between intensities of the light reflected from valleys and ridges of the fingerprint to the photosensitive PIN junctions, and thereby the currents read by the fingerprint current read line may differ from each other. In this way, it is possible to detect the valleys and ridges of the fingerprint (optionally, each photosensitive PIN junction may be in a reverse bias state).

The present disclosure further provides in some embodiments a method of driving the above-mentioned display driving unit circuit, which includes: supplying, by the light-emission control signal generation circuit, a display light-emission control signal to the pixel driving circuit at the display stage; and supplying, by the light-emission control signal generation circuit, a fingerprint detection light-emission control signal to the pixel driving circuit at the fingerprint detection stage to control the pixel driving circuit at the fingerprint detection stage to enable the pixel to emit light in a fingerprint detection light-emission mode. The display stage and the fingerprint detection stage are different time periods.

According to the driving method in the embodiments of the present disclosure, it is possible to supply the fingerprint detection light-emission control signal to the corresponding pixel driving circuit through the light-emission control signal generation circuit at the fingerprint detection stage, and output the photocurrent signal through the photovoltaic conversion element at the fingerprint detection stage, so as perform the fingerprint detection.

In a possible embodiment of the present disclosure, the fingerprint detection light-emission control signal is a square-wave light-emission control signal having a frequency greater than 1000 Hz. In this way, the light from the pixel in the corresponding row may not be perceived by the human eyes at the fingerprint detection stage, so as to prevent the normal display effect from being adversely affected. In addition, at the fingerprint detection stage, the optical signal from each pixel is a square-wave modulated optical signal, the photovoltaic conversion element may convert the square-wave modulated optical signal into a square-wave modulated fingerprint current, so it is able to differentiate the current acquired through the conversion of photovoltaic conversion element from a fingerprint current. A cycle of the square-wave light-emission control signal includes a first time period in which the pixel driving circuit controls the pixel to emit light under the control of the square-wave light-emission control signal and a second time period in which the pixel driving circuit controls the pixel not to emit light under the control of the square-wave light-emission control signal.

The present disclosure provides in some embodiments a display driving circuit including a plurality of light-emission control lines and a plurality of the above-mentioned display driving unit circuits. Each light-emission control line is coupled to a light-emission control signal output end of one pixel driving circuit of the plurality of display driving unit circuits, display stages for pixels in different rows do not overlap each other, and fingerprint detection stages for the pixels in different rows do not overlap each other.

In implementations, the fingerprint detection stages for the pixels in different rows do not overlap each other. In this way, it is possible for the IC to determine the light-emission control line to which a touch position corresponds.

In practice, the light-emission control signal generation circuits of all the display driving unit circuits of the display driving circuit are contained in a light-emission GOA circuit (EM-GOA), which is configured to transmit a modulated light-emission control signal to the plurality of light-emission control lines. Because the modulated light-emission control signal has a high frequency at the fingerprint detection stage, the light emitted by the pixel in the corresponding row may not be perceived by human eyes, and thus the normal display effect may not be adversely affected.

In the embodiments of the present disclosure, the display driving circuit further includes a voltage signal generation GOA circuit (VGL-GOA) which includes a plurality of voltage signal generation circuits each configured to supply a voltage signal VGL-1 to the corresponding light-emission control signal generation circuit, so as to enable the OLED pixels to emit light row by row.

The display driving circuit in the embodiments of the present disclosure is based on the EM-GOA with an Active Matrix Organic Light-Emitting Diode (AMOELD) structure. At the fingerprint detection stage, the OLED pixel generates modulated light under the control of the light-emission control signal. In addition, the display driving circuit further includes the light-emission control GOA circuit and the voltage signal generation GOA circuit (VGL-GOA), so as to supply the modulated light-emission control signal sequentially to each row of pixels, so the normal display effect may substantially not be adversely affected. Further, the photosensitive array design is different from a conventional design, and the display driving circuit in the embodiments of the present disclosure is provided with the photosensitive array rather than any switching array.

The present disclosure provides in some embodiments a display device including the above-mentioned display driving circuit and photovoltaic conversion elements each of which is arranged at a position corresponding to a non-light-emission region, coupled to a fingerprint current read line, and configured to convert a received optical signal into a fingerprint current signal outputted via the fingerprint current read line.

The above are merely optional embodiments of the present disclosure. A person skilled in the art may make modifications and improvements to those embodiments without departing from the principle of the present disclosure, and these modifications and improvements shall also fall within the scope of the present disclosure.

What is claimed is:

1. A display driving unit circuit, comprising: a pixel driving circuit and a light-emission control signal generation circuit;

wherein the light-emission control signal generation circuit is coupled to the pixel driving circuit; the pixel driving circuit is configured to drive a pixel to emit light; the light-emission control signal generation circuit is configured to supply a display light-emission control signal to the pixel driving circuit at a display stage to enable the pixel in a displaying mode and supply a fingerprint detection light-emission control signal to the pixel driving circuit at a fingerprint detection stage to enable the pixel in a fingerprint detection light-emission mode; and wherein the display stage and the fingerprint detection stage are different time periods;

wherein the display driving unit circuit further includes a voltage signal generation circuit;

wherein the voltage signal generation circuit is coupled to the light-emission control signal generation circuit and is configured to supply the fingerprint detection light-emission control signal to a light-emission control signal output end of the light-emission control signal generation circuit at the fingerprint detection stage;

wherein the voltage signal generation circuit includes a first start signal input end, a first clock signal output end, a second clock signal output end, a first level output end, a second level output end, a third level output end and a voltage signal output end, wherein the voltage signal generation circuit further includes:

a first voltage control node control circuit that is coupled to the first start signal input end, the first clock signal output end, the second clock signal output end, the first level output end, the second level output end and a first voltage control node, and is configured to enable a potential of the first voltage control node to be a first level and enable the potential of the first voltage control node to be a second level at the fingerprint detection stage under the control of the first start signal input end, the first clock signal output end, the second clock signal output end, the first level output end, the second level output end;

a second voltage control node control circuit that is coupled to the first voltage control node, the first clock signal output end, the second clock signal output end, the first level output end, the second level output end and a second voltage control node, and is configured to enable a potential of the second voltage control node to be the second level and enable the potential of the second voltage control node to be the first level at the fingerprint detection stage under the control of the first voltage control node, the first clock signal output end, the second clock signal output end, the first level output end and the second level output end; and a voltage signal generation circuit that is coupled to the first voltage control node, the second voltage control node, the third level output end, the second level output end and a voltage signal output end, and is configured to enable the voltage signal output end to receive a signal from the second level output end under the control of the second voltage control node, and enable the voltage signal output end to receive a signal from the third level output end under the control of the first voltage control node at the fingerprint detection stage to enable the voltage signal output end to output the fingerprint detection light-emission control signal at the fingerprint detection stage.

2. The display driving unit circuit according to claim 1, wherein light emitted from the pixel in the displaying mode is of a first frequency, light emitted from the pixel in the fingerprint detection light-emission mode is of a second frequency, and the first frequency is different from the second frequency.

3. The display driving unit circuit according to claim 2, wherein the fingerprint detection light-emission control signal is a square-wave light-emission control signal having a frequency equal to the second frequency;

a cycle of the square-wave light-emission control signal comprises a first time period in which the pixel driving circuit controls the pixel to emit light having a frequency equal to the first frequency under the control of the square-wave light-emission control signal and a second time period in which the pixel driving circuit controls the pixel to emit light having a frequency equal to the second frequency under the control of the square-wave light-emission control signal.

4. The display driving unit circuit according to claim 3, wherein the first frequency is substantially equal to 0 Hz, and the second frequency is greater than 1000 Hz.

5. The display driving unit circuit according to claim 1, wherein the first voltage control node control circuit includes: a first voltage control transistor, a second voltage control transistor, a third voltage control transistor, a fourth voltage control transistor, a fifth voltage control transistor, a sixth voltage control transistor, a seventh voltage control transistor, a first storage capacitor and a second storage capacitor;

wherein a gate electrode of the first voltage control transistor is coupled to the first clock signal output end, and a first electrode of the first voltage control transistor is coupled to the first start signal input end;

wherein a gate electrode of the second voltage control transistor is coupled to a second electrode of the first voltage control transistor, and a second electrode of the second voltage control transistor is coupled to the first clock signal output end;

wherein a gate electrode of the third voltage control transistor is coupled to the first clock signal output end, a first electrode of the third voltage control transistor is coupled to a first electrode of the second voltage control transistor, and a second electrode of the third voltage control transistor is coupled to a low level output end;

wherein a gate electrode of the fourth voltage control transistor is coupled to the first electrode of the third voltage control transistor, a first electrode of the fourth voltage control transistor is coupled to a high level output end, and a second electrode of the fourth voltage control transistor is coupled to the first voltage control node;

wherein a gate electrode of the fifth voltage control transistor is coupled to the second electrode of the first voltage control transistor, a first electrode of the fifth voltage control transistor is coupled to the first voltage control node, and a second electrode of the fifth voltage control transistor is coupled to the second clock signal input end;

wherein a gate electrode of the sixth voltage control transistor is coupled to the gate electrode of the fourth voltage control transistor, and a first electrode of the sixth voltage control transistor is coupled to the high level output end;

wherein a gate electrode of the seventh voltage control transistor is coupled to the second clock signal output end, a first electrode of the seventh voltage control transistor is coupled to a second electrode of the sixth voltage control transistor, and a second electrode of the seventh voltage control transistor is coupled to the gate electrode of the fifth voltage control transistor;

wherein a first end of the first storage capacitor is coupled to the gate electrode of the fifth voltage control transistor, and a second end of the first storage capacitor is coupled to the first voltage control node; and wherein a first end of the second storage capacitor is coupled to the gate electrode of the fourth voltage control transistor, and a second end of the second storage capacitor is coupled to the high level output end.

6. The display driving unit circuit according to claim 5, wherein the second voltage control node control circuit includes: an eighth voltage control transistor, a ninth voltage control transistor and a third storage capacitor;

wherein a gate electrode of the eighth voltage control transistor is coupled to the first voltage control node, a first electrode of the eighth voltage control transistor is coupled to the high level output end, and a second electrode of the eighth voltage control transistor is coupled to the second voltage control node;

wherein a gate electrode of the ninth voltage control transistor is coupled to the first clock signal output end, a first electrode of the ninth voltage control transistor is coupled to the second voltage control node, and a second electrode of the ninth voltage control transistor is coupled to the low level output end; and wherein a first end of the third storage capacitor is coupled to the second voltage control node, and a second end of the third storage capacitor is coupled to the second clock signal output end.

7. The display driving unit circuit according to claim 6, wherein the voltage signal generation circuit includes: a first voltage signal generation transistor and a second voltage signal generation transistor;

wherein a gate electrode of the first voltage signal generation transistor is coupled to the first voltage control node, a first electrode of the first voltage signal generation transistor is coupled to a square-wave voltage signal output end, and a second electrode of the first voltage signal generation transistor is coupled to the voltage signal output end; and wherein a gate electrode of the second voltage signal generation transistor is coupled to the second voltage control node, a first electrode of the second voltage signal generation transistor is coupled to the voltage signal output end, and a second electrode of the second voltage signal generation transistor is coupled to the low level output end.

8. The display driving unit circuit according to claim 1, wherein the pixel driving circuit includes: a first transistor, a second transistor, a third transistor, a fourth transistor, a fifth transistor, a sixth transistor and a storage capacitor;

wherein a gate electrode of the first transistor is coupled to a resetting end, a source electrode of the first transistor is coupled to a resetting voltage signal input end, and a drain electrode of the first transistor is coupled to a first end of the storage capacitor;

wherein a gate electrode of the second transistor is coupled to a corresponding gate line, and a source electrode of the second transistor is coupled to the first end of the storage capacitor;

wherein a gate electrode of the third transistor is coupled to the first end of the storage capacitor, and a source electrode of the third transistor is coupled to a drain electrode of the second transistor;

wherein a gate electrode of the fourth transistor is coupled to a corresponding gate line, a source electrode of the fourth transistor is coupled to a corresponding data line, and a drain electrode of the fourth transistor is coupled to a second end of the storage capacitor;

wherein a gate electrode of the fifth transistor is coupled to a control signal input end, and a source electrode of the fifth transistor is coupled to the second end of the storage capacitor; and wherein a gate electrode of the sixth transistor is coupled to the light-emission control signal input end, a source electrode of the sixth transistor is coupled to an anode of an organic light-emitting diode, and a drain electrode of the sixth transistor is coupled to the source electrode of the third transistor.

9. A display driving unit circuit, comprising: a pixel driving circuit and a light-emission control signal generation circuit;

wherein the light-emission control signal generation circuit is coupled to the pixel driving circuit the pixel driving circuit is configured to drive a pixel to emit light the light-emission control signal generation circuit is configured to supply a di splay light-emission control signal to the pixel driving circuit at a display stage to enable the pixel in a displaying mode and supply a fingerprint detection light-emission control signal to the pixel driving circuit at a fingerprint detection stage to enable the pixel in a fingerprint detection light-emission mode; and wherein the display stage and the fingerprint detection stage are different time periods;

wherein the light-emission control signal generation circuit includes a second start signal input end, a first clock signal output end, a second clock signal output end, a first level output end, a second level output end, a voltage signal output end and a light-emission control signal output end;

wherein the light-emission control signal generation circuit further includes:

a first light-emission control node control circuit that is coupled to the second start signal input end, the first clock signal output end, the second clock signal output end, the first level output end, the second level output end and a first light-emission control node, and is configured to enable a potential of the first light-emission control node to be a first level at the fingerprint detection stage and enable the potential of the first light-emission control node to be a second level at a light-emission stage under the control of the second start signal input end, the first clock signal output end, the second clock signal output end, the first level output end and the second level output end;

a second light-emission control node control circuit that is coupled to the first light-emission control node, the first clock signal output end, the second clock signal output end, the first level output end, the second level output end and a second light-emission control node, and is configured to enable a potential of the second light-emission control node to be the second level at the fingerprint detection stage and enable the potential of the second light-emission control node to be the first level at the light-emission stage under the control of the first light-emission control node, the first clock signal output end, the second clock signal output end, the first level output end and the second level output end; and a light-emission control signal generation circuit that is coupled to the first light-emission control node, the second light-emission control node, the first level output end, the voltage signal output end and the light-emission control signal output end, and is configured to enable the light-emission control signal output end to receive a signal from the first level output end under the control of the first light-emission control node at the light-emission stage, and enable the light-emission control signal output end to receive a signal from the voltage signal output end under the control of the second light-emission control node at the fingerprint detection stage to enable the light-emission control signal output end to output the fingerprint detection light-emission control signal at the fingerprint detection stage.

10. The display driving unit circuit according to claim 9, wherein the first light-emission control node control circuit includes: a first light-emission control transistor, a second light-emission control transistor, a third light-emission control transistor, a fourth light-emission control transistor, a fifth light-emission control transistor, a sixth light-emission control transistor, a seventh light-emission control transistor, a first capacitor and a second capacitor;

wherein a gate electrode of the first light-emission control transistor is coupled to the first clock signal output end, and a first electrode of the first light-emission control transistor is coupled to the second start signal input end;

wherein a gate electrode of the second light-emission control transistor is coupled to a second electrode of the first light-emission control transistor, and a second electrode of the second light-emission control transistor is coupled to the first clock signal output end;

wherein a gate electrode of the third light-emission control transistor is coupled to the first clock signal output end, a first electrode of the third light-emission control transistor is coupled to a first electrode of the second light-emission control transistor, and a second electrode of the third light-emission control transistor is coupled to the low level output end;

wherein a gate electrode of the fourth light-emission control transistor is coupled to the first electrode of the third light-emission control transistor, a first electrode of the fourth light-emission control transistor is coupled to the high level output end, and a second electrode of the fourth light-emission control transistor is coupled to a first light-emission control node;

wherein a gate electrode of the fifth light-emission control transistor is coupled to the second electrode of the first light-emission control transistor, a first electrode of the fifth light-emission control transistor is coupled to the first light-emission control node, and a second electrode of the fifth light-emission control transistor is coupled to the second clock signal output end;

wherein a gate electrode of the sixth light-emission control transistor is coupled to the gate electrode of the fourth light-emission control transistor, and a first electrode of the sixth light-emission control transistor is coupled to the high level output end;

wherein a gate electrode of the seventh light-emission control transistor is coupled to the second clock signal output end, a first electrode of the seventh light-emission control transistor is coupled to a second electrode of the sixth light-emission control transistor, and a second electrode of the seventh light-emission control transistor is coupled to the gate electrode of the fifth light-emission control transistor;

wherein a first end of the first capacitor is coupled to the gate electrode of the fifth light-emission control transistor, and a second end of the first capacitor is coupled to the first light-emission control node; and wherein a first end of the second capacitor is coupled to the gate electrode of the fourth light-emission control transistor, and a second end of the second capacitor is coupled to the high level output end.

11. The display driving unit circuit according to claim 10, wherein the second light-emission control node control circuit includes: an eighth light-emission control transistor, a ninth light-emission control transistor and a third capacitor;

wherein a gate electrode of the eighth light-emission control transistor is coupled to the first light-emission control node, a first electrode of the eighth light-emission control transistor is coupled to the high level output end, and a second electrode of the eighth light-emission control transistor is coupled to the second light-emission control node;

wherein a gate electrode of the ninth light-emission control transistor is coupled to the first clock signal output end, a first electrode of the ninth light-emission control transistor is coupled to a second light-emission control node, and a second electrode of the ninth light-emission control transistor is coupled to the low level output end; and wherein a first end of the third capacitor is coupled to the second light-emission control node, and a second end of the third capacitor is coupled to the second clock signal output end.

12. The display driving unit circuit according to claim 11, wherein the light-emission control signal generation circuit includes: a first light-emission control signal generation transistor and a second light-emission control signal generation transistor;

wherein a gate electrode of the first light-emission control signal generation transistor is coupled to the first light-emission control node, a first electrode of the first light-emission control signal generation transistor is coupled to the high level output end, and a second electrode of the first light-emission control signal generation transistor is coupled to the light-emission control signal output; and wherein a gate electrode of the second light-emission control signal generation transistor is coupled to the second light-emission control node, a first electrode of the second light-emission control signal generation transistor is coupled to the light-emission control signal output end, and a second electrode of the second light-emission control signal generation transistor is coupled to the voltage signal output end.

13. A display driving circuit comprising: a plurality of light-emission control lines and a plurality of display driving unit circuits;

wherein each of the plurality of display driving unit circuit includes a pixel driving circuit and a light-emission control signal generation circuit;

wherein the light-emission control signal generation circuit is coupled to a light-emission control signal input end of the pixel driving circuit and is configured to supply a display light-emission control signal to the pixel driving circuit at a display stage to enable a pixel in a displaying mode and supply a fingerprint detection light-emission control signal to the pixel driving circuit at a fingerprint detection stage to enable the pixel in a fingerprint detection light-emission mode at the fingerprint detection stage;

each of the plurality of light-emission control lines is coupled to a light-emission control signal output end of one pixel driving circuit of the plurality of display driving unit circuits, and display stages for different rows of pixels do not overlap each other, and fingerprint detection stages for different rows of pixels do not overlap each other.

14. A display device, comprising: photovoltaic conversion elements and the display driving circuit according to claim 13, wherein each of the photovoltaic conversion elements is at a position corresponding to a non-light-emission region, coupled to a fingerprint current read line, and configured to convert a received optical signal into a fingerprint current signal and output the fingerprint current signal via the fingerprint current read line.

15. The display device according to claim 14, wherein each of the photovoltaic conversion elements is between two adjacent pixels in a row direction.

16. The display device according to claim 14, wherein each photovoltaic conversion element includes a photo diode having an anode coupled to a fixed electrically-conductive electrode and a cathode coupled to the fingerprint current read line.

* * * * *